US006779149B1

(12) United States Patent
Dong

(10) Patent No.: US 6,779,149 B1
(45) Date of Patent: *Aug. 17, 2004

(54) BURST ERROR CORRECTION ON DVD DATA

(75) Inventor: Chuanyou Dong, San Jose, CA (US)

(73) Assignee: Oak Technology, Inc., Sunnyvale, CA (US)

( * ) Notice: Subject to any disclaimer, the term of this patent is extended or adjusted under 35 U.S.C. 154(b) by 218 days.

This patent is subject to a terminal disclaimer.

(21) Appl. No.: 09/629,082

(22) Filed: Jul. 31, 2000

(51) Int. Cl.[7] ............................................. H03M 13/00
(52) U.S. Cl. ..................................... 714/762; 714/755
(58) Field of Search ................................ 714/769, 755, 714/770, 752, 781, 765, 762, 779, 756, 758, 768, 784; 360/53; 368/48

(56) References Cited

U.S. PATENT DOCUMENTS

| | | | | |
|---|---|---|---|---|
| 5,381,422 A | * | 1/1995 | Shimizu | 714/755 |
| 5,589,994 A | * | 12/1996 | Yamasaki et al. | 360/15 |
| 5,920,578 A | * | 7/1999 | Zook | 714/755 |
| 6,415,411 B1 | * | 7/2002 | Nakamura | 714/755 |

\* cited by examiner

*Primary Examiner*—Albert Decady
*Assistant Examiner*—Mijtaba Chaudry
(74) *Attorney, Agent, or Firm*—Parsons Hsue & de Runtz LLP

(57) ABSTRACT

Method and system for indicating that at least one row or column of a DVD data block has an uncorrectable number of errors, by marking or flagging the corrupted codewords of a codeword with defect detect signals. When a column (or row) of the data block is found to contain more than a thereshold number of errors, a selected number w of distinguishable codeword values (DSVs) "x" is associated with at least one column (or with at least one row) of the block. When the block is further processed and the presence of more than a threshold number of DSVs is sensed, the system interprets this occurrence as indicating that an uncorrectable group of errors has occurred in a column and/or row of the block.

15 Claims, 6 Drawing Sheets

BURST ERROR CORRECTION ON DVD DATA

FIELD OF THE INVENTION

This invention concerns data processing. More particularly, the invention concerns error correction information useful in processing an incoming signal such as a signal obtained by reading media such as DVD discs.

BACKGROUND OF THE INVENTION

A digital data stream from an optical storage device can contain a serial data signal in a binary pattern. Digital data streams are read from various forms of digital media, including CD (compact disc) and DVD formats. CD formats include CD-ROM, CD-audio, CD-R (CD write once) and CD-RW. The data are typically read from selected data locations in order to recover the original data encoded on the storage media. The problem is that there may be dirt or other foreign material such as fingerprints, organic or inorganic substances. Additionally, there may be scratches on the media or defects stamped in the media during manufacturing that alter the data that is read. The presence of such interfering alterations can damage the data, resulting in elevated data error rates prior to data demodulation and correction.

In Reed-Solomon block encoding of DVD data, a P×Q block of data is supplemented with a first group of error control bytes within each of the P rows and with a second group of error control bytes along each of the Q columns of the block, usually at the end of each row or column. These supplemental error control bits allow the system to detect the presence of up to $e(P;c)$ errors in a single column and up to $e(Q;r)$ errors in a single row, if the number of errors in any column or row is not too large, where $e(P;c)$ and $e(Q;r)$ are selected positive integers. Where the number of errors in a given row or given column is too large, detection of presence of one or more errors is possible, but correction of an error in the given row or column is usually impossible using the Reed-Solomon approach. That given row or column must be corrected in some other manner, for example, by retransmission of the given row or column or block. The system may not recognize the presence of a burst error sequence, having too many errors in a given row or column, and may attempt to correct the data and accept the "corrected" data for later processing, which will produce erroneous results.

What is needed is an approach that allows a given row or column of bytes to be flagged in a clear and unambiguous sense for DVD media, where that row or column is tested and found to contain more than a permitted number of errors. Preferably, the approach should be extendible to an arbitrary size data block and should be flexible enough to permit some variation in the flags or other indicia used to indicate presence of burst errors.

SUMMARY OF THE INVENTION

When a defect on a disk is being read, defect detection circuitry will generate a defect detect signal that can be used to mark the data being written to a buffer. An error correction code (ECC) processor can easily determine if a codeword is correctable or uncorrectable, by checking the number of error markers in the codeword. If the number of error markers is greater than an error threshold number, the processor will mark the codeword as uncorrectable. If the number of error markers is no greater than the error threshold number, the processor can correct the error. However, if a defect signal is not provided and the number of corrupted symbols in a codeword is greater than the error threshold number, as where a burst error is present, the ECC processor may produce a "corrected" codeword that is not, in fact, fully corrected.

When a column (or row) in a data block is tested and found to contain more than a threshold number of errors, the symbol values (e.g., byte values) in a selected number of columns (or rows) in that block are associated with (or overwritten by) a distinguishable symbol value ("DSV") whose presence is easily sensed. When one or more DSVs is sensed in a data block, that data block can be subjected to an error control treatment, other than error detection code (EDC) and Reed-Solomon ECC, to attempt to correct the errors and to recover the original correct data in the block.

According to the invention, when a column (or row) of the data block is found to have more than the threshold number of errors, a selected number w of (preferably consecutive) DSVs is placed in at least one column (or in at least one row) of the block. When the block is further processed and the presence of the DSVs is sensed, the system interprets this occurrence as indicating that a group of errors has occurred in a column and/or row of the block.

According to the invention, the determination is made for a serial data stream. The determination is made when reading disc media, which in a particular embodiment is disc media which in some instances conforms to the DVD format. The determination is made for disc media that conform to the DVD format and may also apply for disc media which conforms to a CD format.

BRIEF DESCRIPTION OF THE DRAWINGS

FIGS. 2A, 2B and 2C illustrate an example of an unprocessed data block (2A) and the corresponding data block, after processing according to the invention, where a defect detect signal is used to mark buffered data.

DETAILED DESCRIPTION OF THE INVENTION

Figure 1:
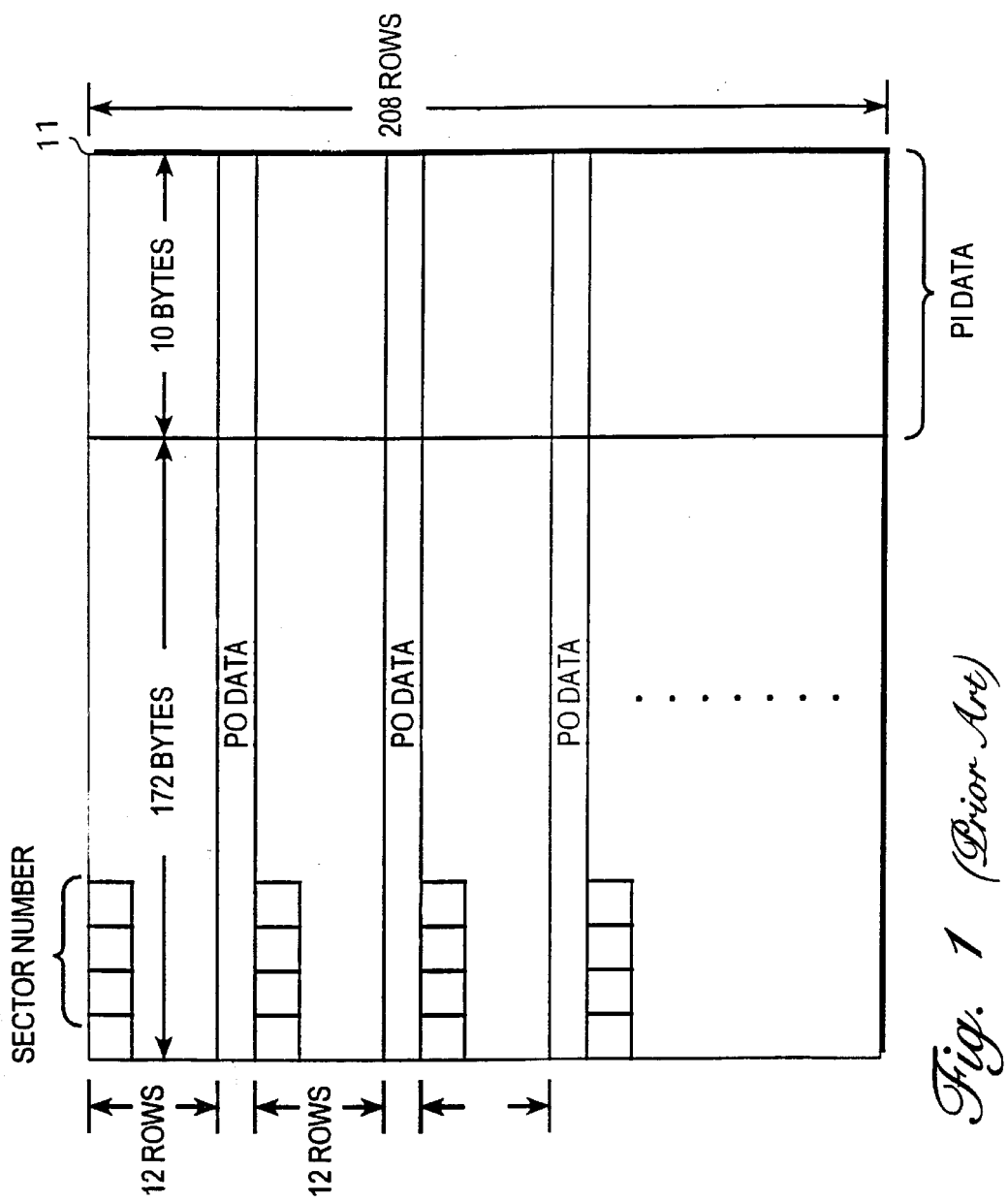
FIG. 1 illustrates a typical P×Q block of data processed according to the invention.

FIG. 1 illustrates a typical P×Q (208×182) block 11 of data, including 10 supplemental error control bytes (or symbols) in each row and 16 supplemental error control bytes (or other symbols) in each column, after processing by a DVD signal processor. The data block 11 includes 208 rows of 182 bytes or other symbols each. Reading the block from left to right and from top to bottom in sections, each section includes 12 rows of data bytes, with each row including 172 data bytes and 10 data correction bytes for the preceding 172 data bytes in the same row. The 10 data correction bytes in each row are known to those of ordinary skill in the art as inner code parity (PI) data. The thirteenth row (or some other designated row) in each section 11S includes supplemental error data bytes that are known to those of ordinary skill in the art as outer code parity (PO) data. Although the correction data bytes are interleaved with actual data, in the example shown in FIG. 1, the P×Q data block and supplemental data bytes are preferably processed as columns. A "full" data block includes 208 rows, each with 172 data bytes and 10 PI error correction bytes per row, and includes 182 columns, with each column having 192 data bytes and 16 PO error correction bytes. Optionally, every thirteenth row of data includes a sector number that identifies the block sector number for the user data contained therein, for purposes of error control reprocessing.

Figure 2A:
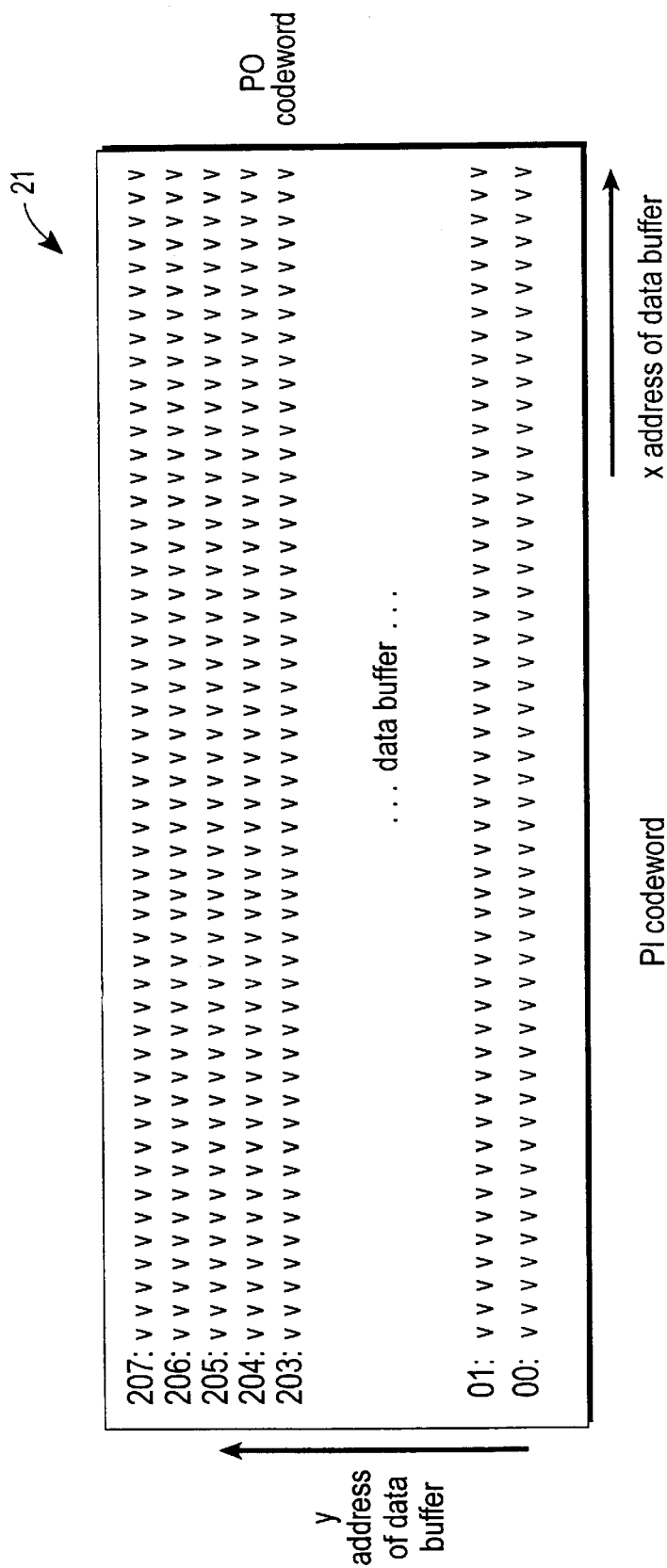

FIG. 2A illustrates a 182×208 block 21 of stream data, including the error control data, where each symbol "v" represents a a symbol of a codeword (e.g., a byte). If the data block 21 is analyzed, each column is found to contain no more than a column threshold number of e(P;c)=10 errors, and each row is found to contain no more than a row threshold number of e(Q;r)=16 errors, the data block 21 can be processed according to standard Reed-Solomnon techniques, and a supplemented data block 11 (FIG. 1) results.

Figure 2B:
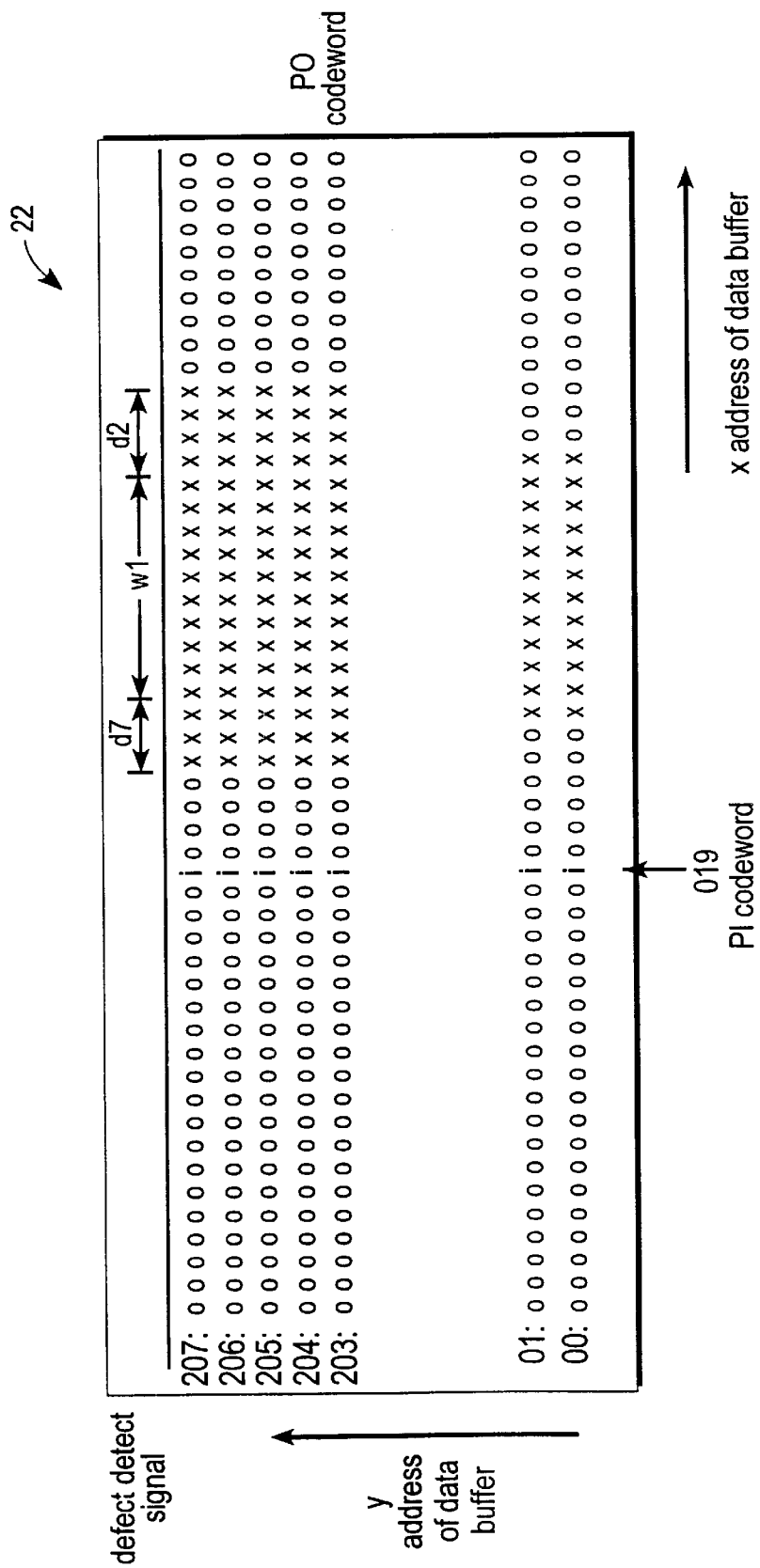
Figure 26:
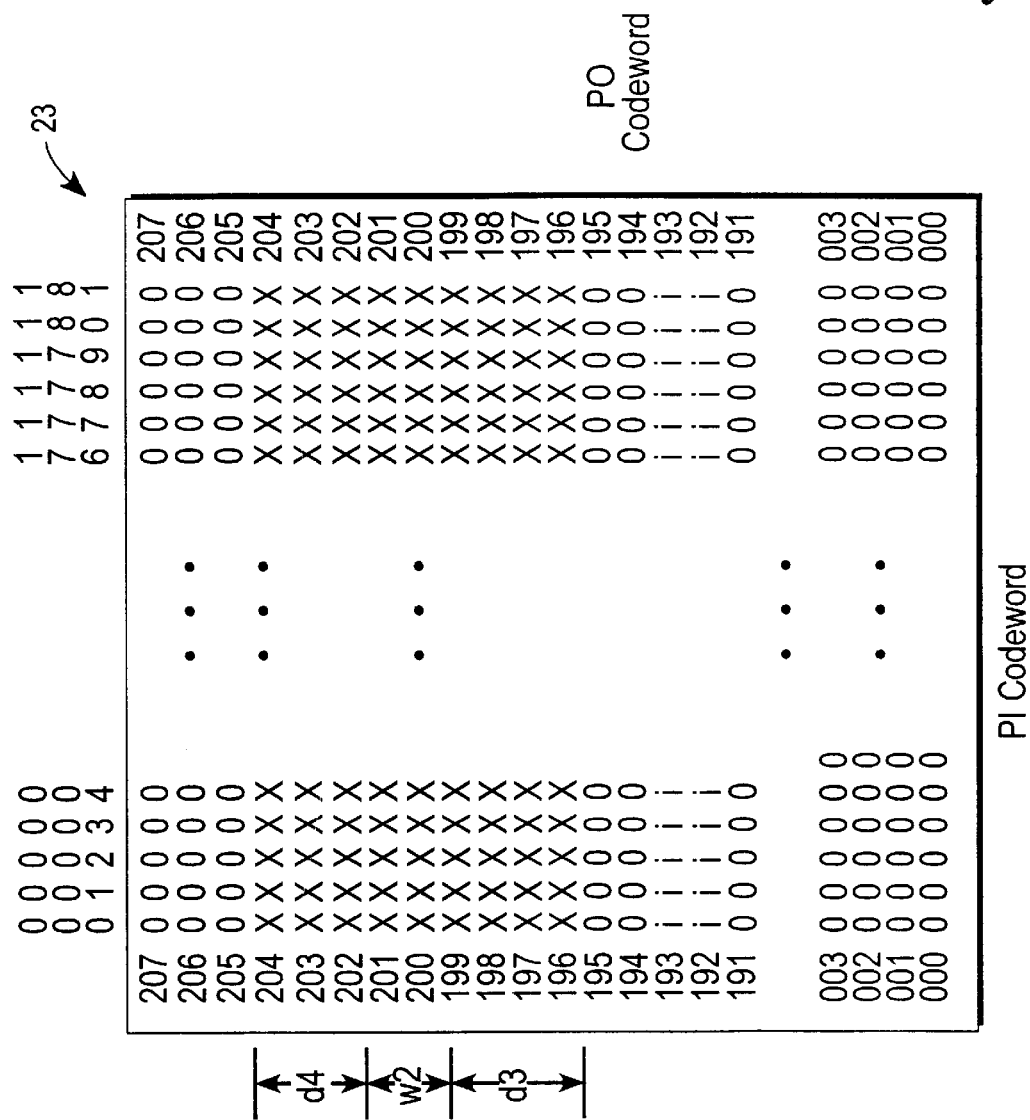

With reference to FIG. 2B, a defect detect signal is used to mark or flag a symbol (designated as "x") having an error in the buffered data in a data block 22. If a symbol has no error, the symbol is not marked or flagged. A preferred method of marking or flagging a symbol error provides an error map of size P×Q bits, with each bit corresponding to a symbol in the data block 22. Where a symbol has no error or the error is correctable, the corresponding bit in the error map may have a first value, such as "0." Where a symbol has an error, the corresponding bit in the error map has a second value, such as "1." A second method of marking a symbol that has an error replaces the symbol with a distinguishable symbol value ("DSV") that is otherwise unallowed. For example, if signal transmission protocol allows no more than, say, six consecutive 0's or six consecutive 1's to appear, because of load balancing or other concerns, the symbol "x" may be chosen to be seven or eight consecutive 0's or seven or eight consecutive 1's within a symbol.

Where the number of symbol errors in a given column (or row) is no greater than the threshold number e(P;c) (or e(Q;r)), the errors in that column (or row) can be corrected, and no special treatment is required for that column (or row). For example, where the block has P=182 rows and has Q=208 columns, including the error control symbols, the threshold error numbers are e(P;c)=10 and e(Q;r)=16.

Assume that each of w1 columns of symbols in a data block 22 has been corrupted by a burst error having more than e(P;c) errors therein, where w1 is a positive integer, including the integer 1, as in FIG. 2B. A total of d1+w1+d2 consecutive columns are marked with an "x", where d1 and d2 are selected non-negative integers, although only w1 columns are known to contain more than e(P;c) errors therein. The integers d1 and d2 may be adjusted to take account of t have more than the threshold number e(P;c) symbol errors therein, symbols in one or more additional and contiguous columns may also be suspect and may need to be marked or flagged.

When the data block 22 in FIG. 2B with the DSV ("x") impressed is further processed for error control purposes, the system will readily sense the presence of one or more rows with more than a threshold number with markers therein and will, according to the invention, interpret this occurrence as indicating that the PI codeword and/or the PO codeword in the data block 22 is uncorrectable. The system will process this data block in a manner that is more likely to recover the original, for example, by retransmitting the entire data block.

FIG. 2B illustrates the marking or flagging of each of d1+w1+d2 columns with uncorrectable error signals ("x") when a defect occurs. FIG. 2C illustrates the analogous marking or flagging of each of d3+w2+d4 rows of data block 23 with uncorrectable error signals ("x") that occurs when each of w2 rows is found to have more than e(Q;r) errors therein. The invention may be applied to column errors and then to row errors, or to row errors and then to column errors. That is, the order of determination of the number of errors in each column and in each row may be inverted.

Figure 3:
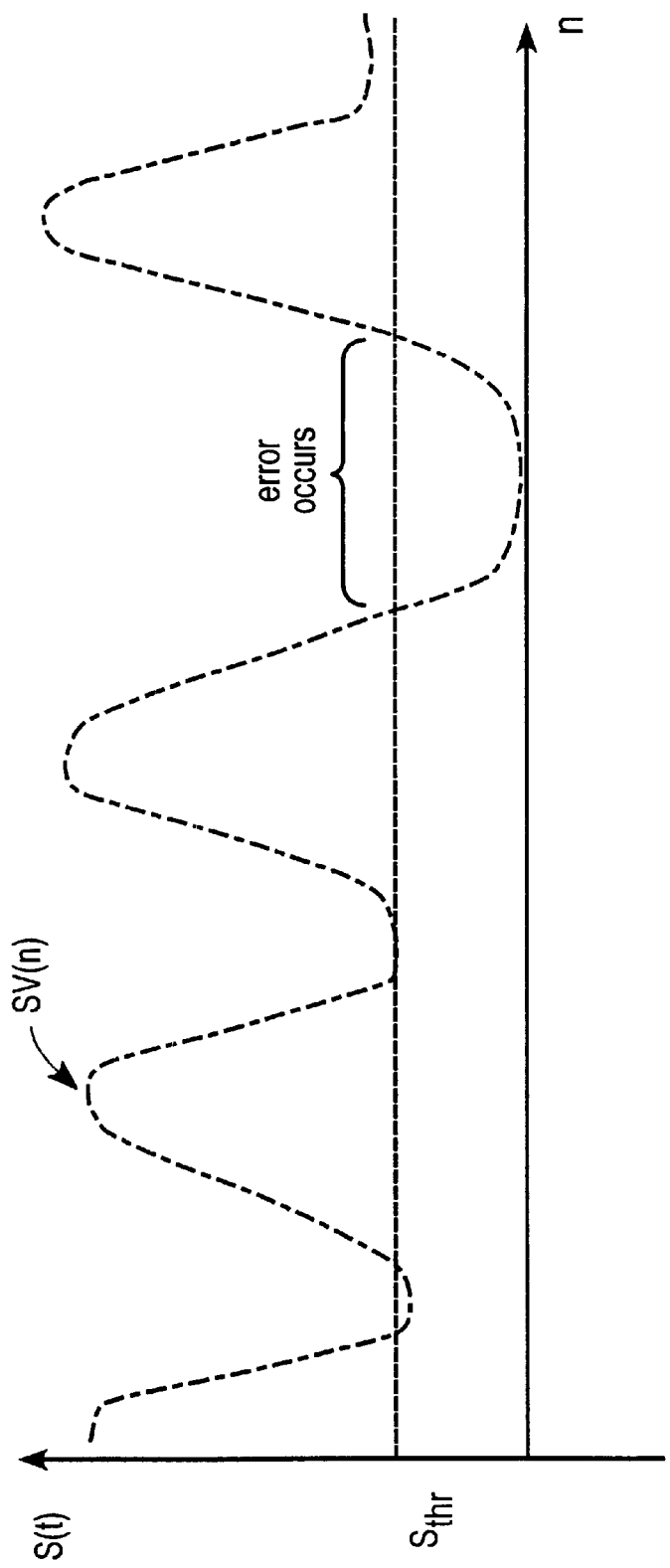
FIG. 3 is a graphical view of a value of a received signal relative to a threshold value for signal definition.

FIG. 3 graphically illustrates an envelope of a sequence of digital values sv(n) (n=1, 2, . . . ) of a representative signal s(t) that is received and analyzed by the system. A lo peak of the signal s(t) has suitable signal definition if the amplitude of the peak is above a signal definition threshold amplitude Sthr. Where the peak of the signal is near or below the value Sthr, signal definition is poor, and the sensed digital value sv(n) is likely to be, or almost certainly is, wrong. If one digital value amplitude is substantially below the value Sthr, and thus erroneous, it is likely that one or more adjacent digital value amplitudes is also erroneous. For this reason, it is often preferable to associate a DSV with one or more digital signal values that are adjacent to a digital signal value that is known to be in error.

Figure 4:
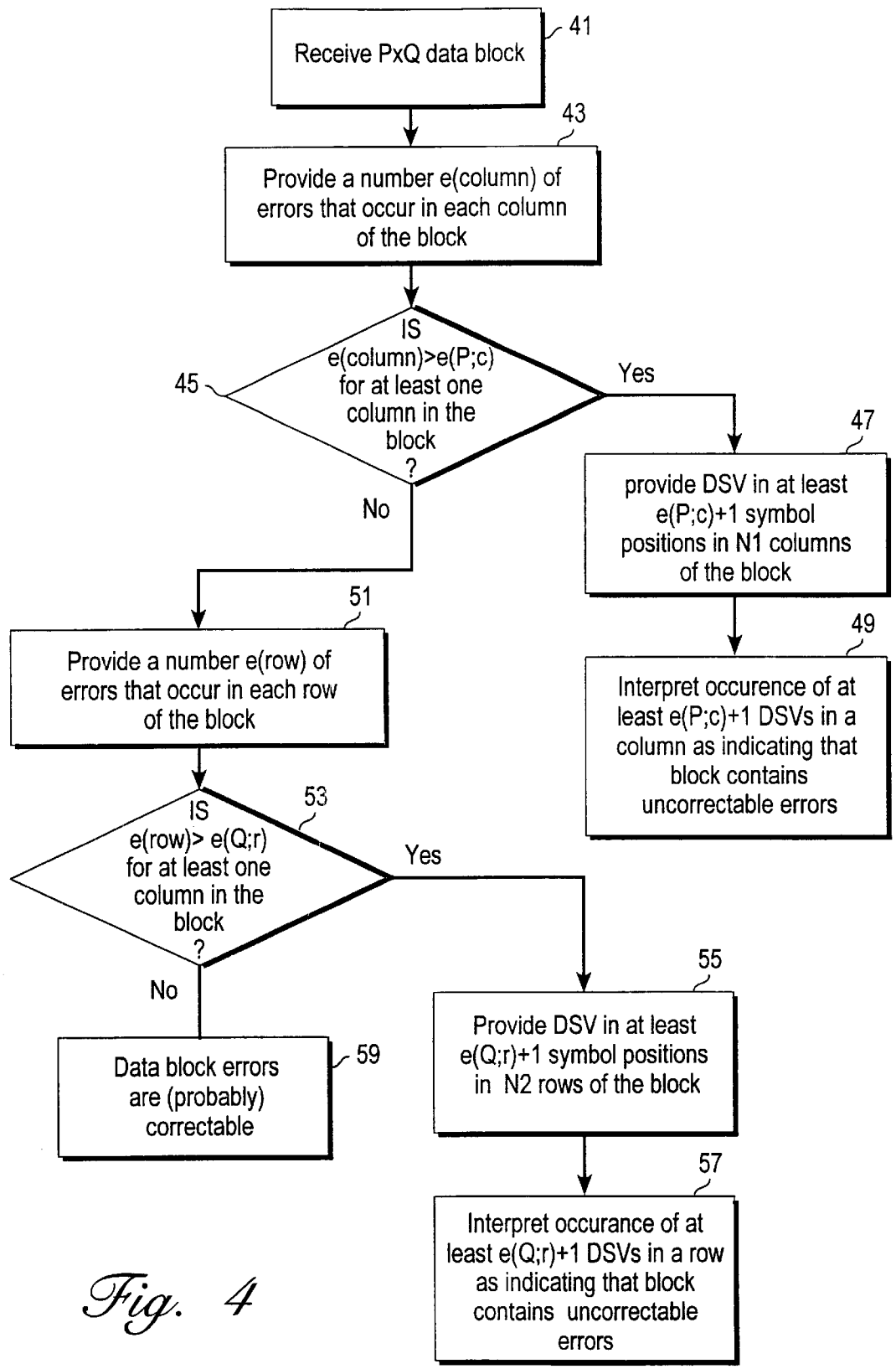
FIG. 4 is a flow chart illustrating practice of the invention.

FIG. 4 is a flow chart illustrating a procedure for practicing the invention, where column errors are first evaluated. In step 41, the system receives a P×Q data block of symbols. In step 43, the system determines or provides a number e(column) of errors that occur in each column. In step 45, the system determines if, for at least one column, e(column)>e(P;c), where e(P;c) is a selected column threshold number. If the answer to the query in step 45 is "yes", the system associates a DSV with a data value in at least e(P;c)+1 symbol positions in N1 rows of the block, in step 47, where N1 is a selected positive number. In step 49, the system interprets occurrence of at least e(P;c)+1 consecutive DSVs in N1 rows as indicating that the errors in that codeword are uncorrectable, and the system moves to step 51. If the answer to the query in step 45 is "no", the system optionally corrects the column errors and proceeds to step 51.

In step 51, the system determines or provides a number e(row) of errors that occur in each row. In step 53, the system determines if, for at least one row, e(row)>e(Q;r), where e(Q;r) is a selected row threshold number. If the answer to the query in step 53 is "yes", the system associates a DSV with a data value in at least e(Q;r)+1 symbol positions in N2 columns of the block, in step 55, where N2 is a selected positive number. In step 57, the system interprets occurrence of at least e(Q;r)+1 consecutive DSVs in N2 columns as indicating that the errors in that codeword are uncorrectable. If the answer to the query in step 53 is "no", the system optionally corrects the row errors, proceeds to step 59 (optional) and interprets this condition as indicating that the errors in the data block are likely to be correctable. In the present invention, data formats, such as those found on DVD discs, are used in which the sync data may also contain information that can be used to indicate a location within a sector.

What is claimed is:

1. A method for error control processing of a block of DVD data, the method comprising:

receiving a block of data having P rows of codeword symbols and Q columns of codeword symbols, where P and Q are selected positive integers;

providing a number e(column) indicating a number of errors in at least one column of within the data block;

when the number e(column) for at least N1 columns is larger than a selected column threshold error number e(thr;c), providing a distinguishable codeword value in a variable number of at least e(thr;c)+1 codeword positions for data in each of N2 rows within the data block, where N1 and N2 are selected positive integers with N2 e(thr;c)+1; and interpreting occurrence of at least e(thr;c)+1 distinguishable codeword values in at least one column within the data block as indicating that the data block contains at least one column with an uncorrectable error.

2. The method of claim 1, further comprising providing said number e(column) for at least one column in said data block using a defect detect signal.

3. The method of claim 1, further comprising choosing said integer P=182 and choosing said integer Q=208.

4. The method of claim 1, further comprising choosing said integer N1=1.

5. The method of claim 1, further comprising:

providing a number e(row) indicating a number of errors in at least one row of said data block;

when the number e(row) for at least N3 rows is larger than a selected row threshold number e(thr;r), providing a distinguishable codeword value in at least e(thr;r)+1 codeword positions for data in each of N4 columns within said data block, where N3 and N4 are selected positive integers with N4 e(thr;r)+1; and interpreting occurrence of at least e(thr;r)+1 distinguishable codeword values in at least one row within said data block as indicating that said data block contains at least one row with an uncorrectable error.

6. The method of claim 5, further comprising choosing said integer P=182 and choosing'said integer Q=208.

7. The method of claim 5, further comprising choosing said integer N3=1.

8. The method of claim 5, further comprising:

when said number e(column) of errors in each column is no larger than said number e(thr;c) and said number e(row) of errors in each row is no larger than said number e(thr;r), interpreting this occurrence as indicating that said errors in said data block are likely to be correctable.

9. A method for error control processing of a block of DVD data, the method comprising:

receiving a block of data having P rows of codeword symbols and Q columns of codeword symbols, where P and Q are selected positive integers;

providing a number e(row) indicating a number of errors in at least one row within the data block;

when the number e(row) for at least N3 rows is larger than a selected row threshold number e(thr;r), providing a distinguishable codeword value in at least e(thr;r)+1 codeword positions in each of N4 columns within the data block, where N3 and N4 are selected positive integers with N4 e(thr:r)+1; and interpreting occurrence of at least e(thr;r)+1 distinguishable codeword values in at least one row within the data block as indicating that the data block contains at least one row with an uncorrectable error.

10. The method of claim 9, further comprising providing said number e(column) for at least one column in said data block using a defect detect signal.

11. The method of claim 9, further comprising choosing said integer P=182 and choosing said integer Q=208.

12. The method of claim 9, further comprising choosing said integer N3=1.

13. A method for error control processing of a block of DVD data, the method comprising:

receiving a P×Q data block of P rows and Q columns of data, where P and Q are selected positive integers;

providing a limit e(thr;c) for number of errors that can be corrected in a column within the data block;

comparing number of errors e(column) in at least one column within the data block with e(thr;c);

when the number of errors in the at least one column is larger than e(thr;c), providing at least e(thr;c)+1 codewords in at least one selected column within the data block with a distinguishable codeword value; and when at least one column the data block has at least e(thr:c)+1 distinguishable codeword values, interpreting this occurrence as indicating that the data block has at least one uncorrectable error.

14. The method of claim 13, further comprising:

providing a limit e(thr;r) for number of errors that can be corrected in a row of said data block;

comparing number of errors in at least one row within said data block with e(thr;r);

when the number of errors in the at least one row is larger than e(thr;r), providing at least e(thr;r)+1 codewords in at least one selected row within said data block with a distinguishable codeword value; and when at least one row within the data block has at least e(thr;r)+1 distinguishable codeword values, interpreting this occurrence as indicating that the data block has at least one uncorrectable error.

15. The method of claim 14, further comprising:

when said number e(column) of errors in each column is no larger than said number e(thr;c), and said number e(row) of errors in each row is no larger than said number e(thr;r), interpreting this occurrence as indicating that said errors in said data block are likely to be correctable.

* * * * *